United States Patent
Granger-Jones

(10) Patent No.: US 12,244,270 B2
(45) Date of Patent: Mar. 4, 2025

(54) CURRENT MODE MULTI-INPUT MAXIMUM SIGNAL DETECTOR

(71) Applicant: Qorvo US, Inc., Greensboro, NC (US)

(72) Inventor: Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 633 days.

(21) Appl. No.: 17/576,306

(22) Filed: Jan. 14, 2022

(65) Prior Publication Data

US 2023/0231521 A1 Jul. 20, 2023

(51) Int. Cl.
*H03F 1/02* (2006.01)
*H03F 3/24* (2006.01)

(52) U.S. Cl.
CPC ........... *H03F 1/0227* (2013.01); *H03F 3/245* (2013.01); *H03F 2200/102* (2013.01); *H03F 2200/462* (2013.01); *H03F 2200/474* (2013.01)

(58) Field of Classification Search
CPC .. H03F 1/0227; H03F 3/245; H03F 2200/102; H03F 2200/462; H03F 2200/474; H03F 3/19
USPC .................................................. 330/297, 257
See application file for complete search history.

(56) References Cited

U.S. PATENT DOCUMENTS

| | | | |
|---|---|---|---|
| 4,338,551 A * | 7/1982 | Mizumoto | H02P 6/28 318/400.26 |
| 4,477,848 A | 10/1984 | McWhirter et al. | |
| 4,827,458 A | 5/1989 | D'Alayer de Costemore D'Arc | |
| 5,304,864 A | 4/1994 | Hong et al. | |
| 8,665,016 B2 | 3/2014 | Chowdhury et al. | |
| 9,445,371 B2 | 9/2016 | Khesbak et al. | |
| 9,748,912 B2 | 8/2017 | Choi et al. | |
| 10,181,826 B2 | 1/2019 | Khlat et al. | |

(Continued)

FOREIGN PATENT DOCUMENTS

WO 2012050257 A2 4/2012

OTHER PUBLICATIONS

Nakase, et al., "A BiCMOS Wired-OR logic," IEEE Journal of Solid-State Circuits, vol. 30, Issue 6, Jun. 1995, pp. 622-628.

(Continued)

*Primary Examiner* — Andrea Lindgren Baltzell
*Assistant Examiner* — Khiem D Nguyen
(74) *Attorney, Agent, or Firm* — Withrow & Terranova, P.L.L.C.

(57) ABSTRACT

A maximum current detection circuit with multiple input current ports and a maximum current port generates, on the maximum current port, a maximum current corresponding to the largest input current on one of the input current ports. The maximum current detection circuit includes multiple current mirror circuits, each controlled by one of the input currents. Each of the current mirror circuits includes outputs, each coupled to a respective one of the input current ports and the maximum current port. The current mirror circuit controlled by the largest input current becomes the dominant source for the input currents on each of the input current ports and also drives the maximum current on the maximum current port. The input currents may be single-ended or differential signals. The input currents may be respectively delayed signals of a windowing circuit in an envelope tracking circuit controlling a power amplifier of a wireless device.

16 Claims, 8 Drawing Sheets

(56) References Cited

U.S. PATENT DOCUMENTS

| | | |
|---|---|---|
| 10,516,368 B2 | 12/2019 | Balteanu et al. |
| 10,530,311 B2 | 1/2020 | Khlat et al. |
| 10,615,757 B2 | 4/2020 | Balteanu et al. |
| 10,985,703 B2 | 4/2021 | Balteanu et al. |
| 10,985,711 B2 | 4/2021 | Balteanu et al. |
| 11,303,255 B2 | 4/2022 | Khesbak et al. |
| 2003/0146791 A1 | 8/2003 | Shvarts et al. |
| 2008/0242246 A1 | 10/2008 | Minnis et al. |
| 2010/0271123 A1 | 10/2010 | Forrester et al. |
| 2012/0313701 A1 | 12/2012 | Khlat et al. |
| 2014/0184335 A1 | 7/2014 | Nobbe et al. |
| 2016/0050629 A1 | 2/2016 | Khesbak et al. |
| 2016/0099687 A1 | 4/2016 | Khlat |
| 2016/0118941 A1 | 4/2016 | Wang |
| 2017/0170838 A1 | 6/2017 | Pagnanelli |
| 2017/0310398 A1 | 10/2017 | Masuda |
| 2017/0359029 A1 | 12/2017 | Nobbe et al. |
| 2018/0076772 A1 | 3/2018 | Khesbak et al. |
| 2019/0109613 A1 | 4/2019 | Khlat et al. |
| 2020/0177131 A1 | 6/2020 | Khlat |
| 2022/0052646 A1 | 2/2022 | Khlat |
| 2022/0052647 A1 | 2/2022 | Khlat et al. |
| 2022/0052648 A1 | 2/2022 | Khlat |
| 2022/0052649 A1 | 2/2022 | Retz et al. |
| 2022/0052650 A1 | 2/2022 | Khlat |
| 2022/0052651 A1 | 2/2022 | Khlat |
| 2022/0052655 A1 | 2/2022 | Khlat |
| 2022/0115987 A1 | 4/2022 | Granger-Jones |
| 2022/0115988 A1 | 4/2022 | Khlat et al. |
| 2022/0116029 A1 | 4/2022 | Khlat et al. |
| 2022/0165323 A1 | 5/2022 | Zhu |
| 2022/0166416 A1 | 5/2022 | Zhu |

OTHER PUBLICATIONS

Wan, et al., "Negative Group Delay Theory of a Four-Port RC-Network Feedback Operational Amplifier," IEEE Access, vol. 7, Jun. 24, 2019, pp. 75708-75720.

Williams, Arthur, et al., "Electronic Filter Design Handbook," Third Edition, 1995, McGraw-Hill, Inc. pp. 7.10-7.14.

Non-Final Office Action for U.S. Appl. No. 17/363,522, mailed Nov. 25, 2022, 8 pages.

Final Office Action for U.S. Appl. No. 17/406,550, mailed Aug. 15, 2023, 31 pages.

Advisory Action for U.S. Appl. No. 17/406,550, mailed Oct. 20, 2023, 3 pages.

Notice of Allowance and Examiner-Initiated Interview Summary for U.S. Appl. No. 17/406,530, mailed Mar. 21, 2024, 11 pages.

Non-Final Office Action for U.S. Appl. No. 17/406,550, mailed Mar. 13, 2023, 25 pages.

Notice of Allowance for U.S. Appl. No. 17/406,550, mailed Nov. 22, 2023, 12 pages.

U.S. Appl. No. 17/363,522, filed Jun. 30, 2021.

U.S. Appl. No. 17/406,530, filed Aug. 19, 2021.

U.S. Appl. No. 17/406,550, filed Aug. 19, 2021.

Non-Final Office Action for U.S. Appl. No. 17/363,522, mailed Jul. 11, 2022, 7 pages.

* cited by examiner

CURRENT MODE MULTI-INPUT MAXIMUM SIGNAL DETECTOR

FIELD OF THE DISCLOSURE

The technology of the disclosure relates generally to envelope tracking and, more particularly, to tracking a maximum amplitude among multiple input signals.

BACKGROUND

Hand-held devices with one or more types of wireless communication capability are commonplace and even relied upon in many ways. Fifth-generation new radio (5G-NR) technology is a technological advancement that can provide greater data throughput, increased range of coverage, and reduced latency compared to previous wireless technology generations. Another benefit of 5G-NR is improved power efficiency, which includes maximizing performance while optimizing power consumption. A significant portion of the power consumed in a wireless device is consumed by power amplifiers used for signal transmission circuits. The power supply voltage needed to keep a power amplifier in an optimum operating range depends on the amplitude of the signal being transmitted, which varies with time. However, providing the power amplifier with a greater power supply voltage than necessary at any given moment merely wastes power, which reduces battery life. Envelope tracking is a method in which the signal amplitude is tracked, and the supply voltage provided to the power amplifier is adjusted accordingly to maintain a high-performance level without wasting power. At high signal frequencies, such as those used in 5G-NR, it can be difficult to avoid letting the power supply voltage drop below a level needed for a desired efficiency as signal amplitude suddenly changes.

SUMMARY

Aspects disclosed in the detailed description include a current mode multi-input maximum signal detector. A maximum current detection circuit with multiple input current ports and a maximum current port generates, on the maximum current port, a maximum current corresponding to the largest input current on one of the input current ports. The maximum current detection circuit includes multiple current mirror circuits, each controlled by one of the input currents. Each of the current mirror circuits includes outputs, each coupled to a respective one of the input current ports and the maximum current port. The current mirror circuit controlled by the largest input current becomes the dominant source for the input currents on each of the input current ports and also drives the maximum current on the maximum current port. In some examples, the multiple input currents are delayed signals of an envelope signal, each delayed a respective delay time by a respective delay circuit of a windowing circuit in an envelope tracking circuit controlling a power amplifier of a wireless device. In such examples, the maximum current generated by the maximum current detection circuit controls a supply voltage of the power amplifier that amplifies an analog signal with an amplitude indicated by the envelope signal. The maximum current keeps the power amplifier in an efficient operating range while reducing power consumption. In some examples, the input currents are received as single-ended signals, and the maximum current is generated as a single-ended signal. In some examples, the input currents are received as differential signals, and the maximum current is generated as a differential signal with an amplitude indicated by a positive current and a negative current.

In another exemplary aspect, a wireless device is disclosed. The wireless device comprises a transceiver configured to generate, based on a received analog signal, an output analog signal on a signal output, and an envelope signal based on a magnitude envelope of the output analog signal on an envelope output. The wireless device includes a delay circuit configured to receive the envelope signal on a signal input, generate a first delayed envelope signal based on the envelope signal on a first delay output, generate a second delayed envelope signal based on the envelope signal on a second delay output, and generate a third delayed envelope signal based on the envelope signal on a third delay output. The wireless device includes a maximum current detection circuit comprising: a first current port coupled to the first delay output, a second current port coupled to the second delay output, a third current port coupled to the third delay output, and a maximum current port. The maximum current detection circuit further comprises a first current mirror circuit comprising: a first input coupled to the first current port, a first mirror input coupled to the second current port, and a first mirror output coupled to the maximum current port, and a second current mirror circuit comprising: a second input coupled to the second current port, a second mirror input coupled to the first current port, and a second mirror output coupled to the maximum current port. The wireless device also includes a power amplifier configured to amplify the output analog signal based on a supply voltage based on a maximum current on the maximum current port.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

Figure 7:
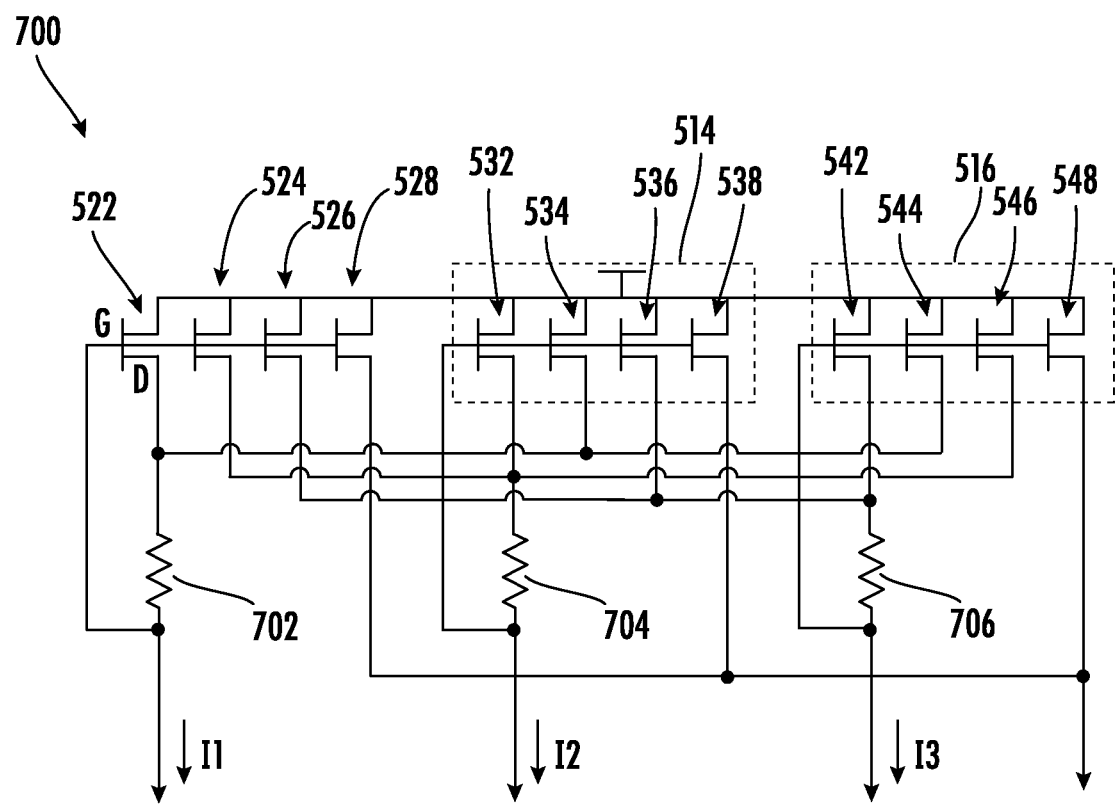
Figure 8A:
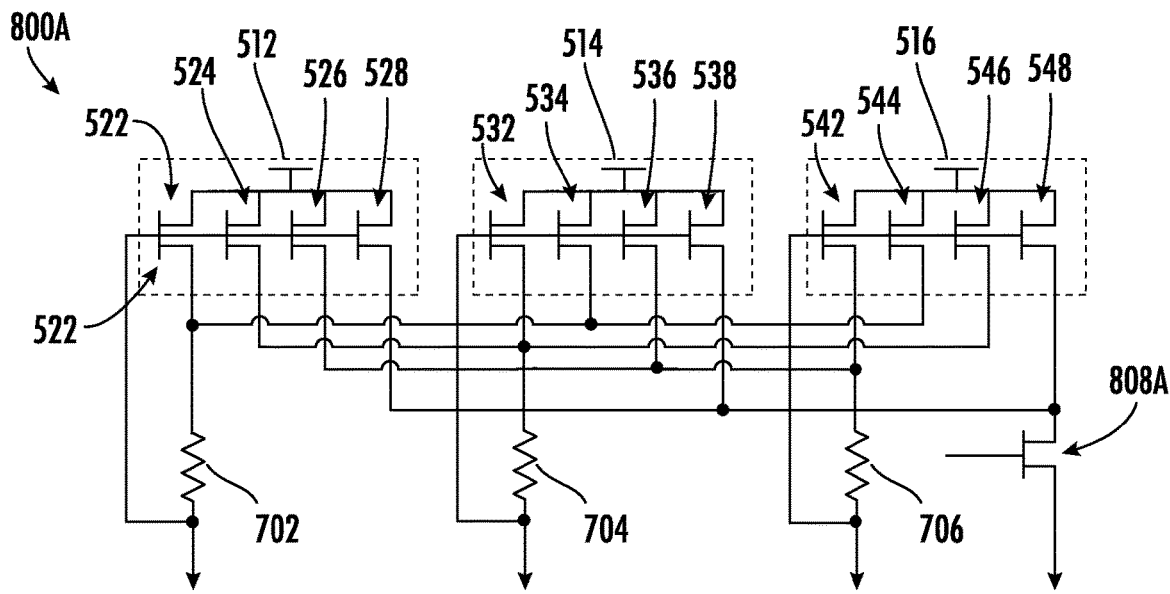
Figure 8B:
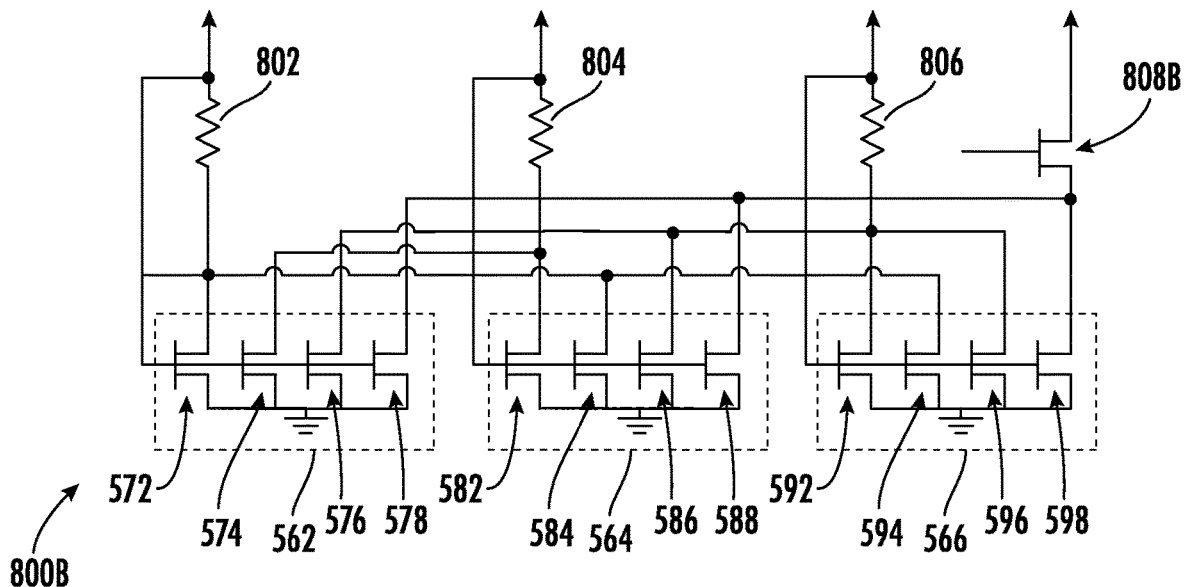

FIG. 7 is a schematic diagram of a three-input single-ended maximum current detection circuit including resistors placed in series with the input currents to increase feedback loop gain to reduce switching delays; and FIGS. 8A and 8B are schematic diagrams of a three-input differential maximum signal detector including resistors to increase feedback loop gain and an output cascode transistor to reduce output distortion.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic, and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclosed in the detailed description include a current mode multi-input maximum signal detector. A maximum current detection circuit with multiple input current ports and a maximum current port generates, on the maximum current port, a maximum current corresponding to the largest input current on one of the input current ports. The maximum current detection circuit includes multiple current mirror circuits, each controlled by one of the input currents. Each of the current mirror circuits includes outputs, each coupled to a respective one of the input current ports and the maximum current port. The current mirror circuit controlled by the largest input current becomes the dominant source for the input currents on each of the input current ports and also drives the maximum current on the maximum current port. In some examples, the multiple input currents are delayed signals of an envelope signal, each delayed a respective delay time by a respective delay circuit of a windowing circuit in an envelope tracking circuit controlling a power amplifier of a wireless device. In such examples, the maximum current generated by the maximum current detection circuit controls a supply voltage of the power amplifier that amplifies an analog signal with an amplitude indicated by the envelope signal. The maximum current keeps the power amplifier in an efficient operating range while reducing power consumption. In some examples, the input currents are received as single-ended signals, and the maximum current is generated as a single-ended signal. In some examples, the input currents are received as differential signals, and the maximum current is generated as a differential signal.

Figure 1:
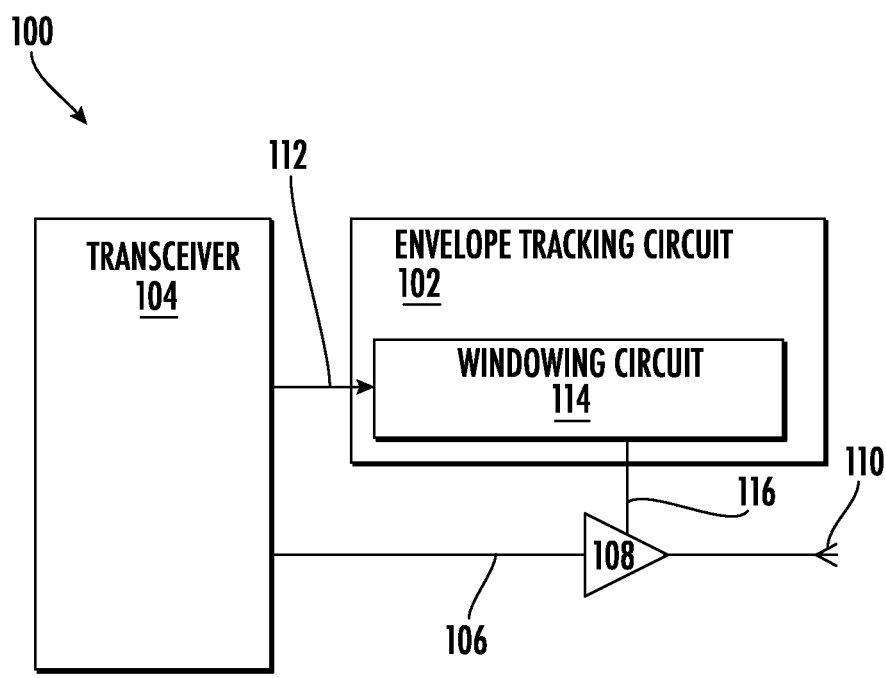
FIG. 1 is an illustration of a fifth-generation new radio (5G-NR) wireless device including an envelope tracking (ET) circuit to improve power amplifier efficiency.

FIG. 1 is an illustration of a fifth-generation new radio (5G-NR) wireless device 100, including an envelope tracking (ET) circuit 102 to improve efficiency of a power amplifier. The 5G-NR wireless device 100 includes a transceiver 104 that generates an analog signal 106 to be amplified in a power amplifier 108 for transmission over an antenna 110. The transceiver also generates an envelope signal 112, indicating an amplitude of the analog signal 106. The ET circuit 102 includes a windowing circuit 114 that receives the envelope signal 112 and generates a supply voltage 116 at a high enough level to keep the power amplifier 108 operating in an efficient range without consuming excess power. There is a delay from the windowing circuit 114 receiving the envelope signal 112 to generating the appropriate supply voltage 116. When there are sudden changes in amplitude of the analog signal 106, the delay can allow the level of the supply voltage 116 to drop below the level needed for efficient operation.

Figure 2A:
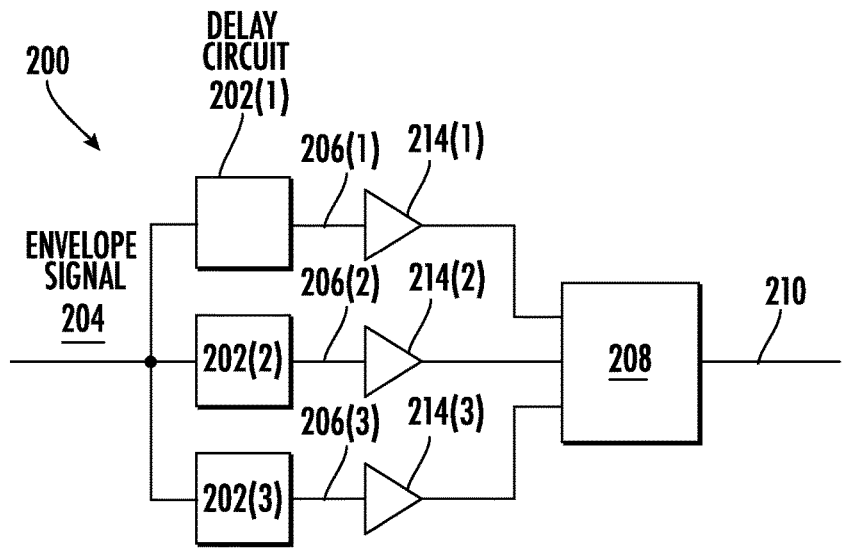
FIG. 2A is an illustration of an ET windowing function in which an analog input signal is delayed by three different delays to generate three single-ended current signals provided to a maximum signal detector.
Figure 2B:
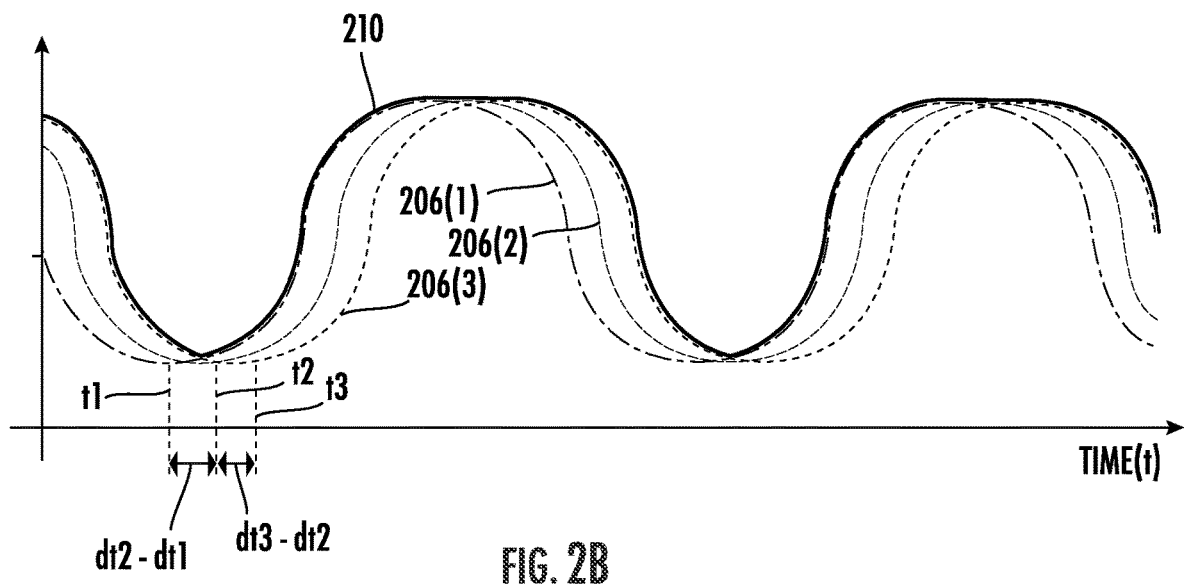
FIG. 2B is a graph of the three single-ended current signals provided to the maximum signal detector and a maximum current output.

In this regard, the windowing circuit 200 shown in FIG. 2A includes delay circuits 202(1), 202(2), and 202(3) that provide a timing window or margin in which adjustments to the power supply voltage can be made in response sudden increases or decreases of an envelope signal 204 without allowing the power supply voltage to drop to an inefficient level. The windowing circuit 200 is an example of the windowing circuit 114 in FIG. 1. The envelope signal 204 is received on an envelope signal input. Each of the delay circuits 202(1)-202(3) includes a signal input coupled to the envelope signal input. The envelope signal 204 is received and delayed for different delay times dt1, dt2, dt3 by the respective delay circuits 202(1), 202(2), and 202(3) to generate first, second, and third delayed envelope signals 206(1)-206(3). FIG. 2B is an illustration of the first, second, and third delayed envelope signals 206(1)-206(3) based on the envelope signal 204 (not shown) arriving at time t0. The first delayed envelope signal 206(1) is generated from the envelope signal 204 delayed by the delay circuit 202(1) and arrives at time t1=(t0+dt1). The second delayed envelope signal 206(2) delayed by the delay circuit 202(2) arrives at time t2=(t0+dt2). The third delayed envelope signal 206(3) delayed by the delay circuit 202(3) arrives at time t3=(t0+dt3). If dt2 is greater than dt1 (i.e., dt2>dt1) and dt3 is greater than dt2 (i.e., dt3>dt2), the first delayed envelope signal 206(1) will lead the second delayed envelope signal 206(2) by a time dt2-dt1 and the second delayed envelope signal 206(2) will lead the third delayed envelope signal 206(3) by a time dt3−dt2.

A maximum current detection circuit 208 generates a maximum current signal 210 for controlling the level of a supply voltage to a power amplifier (e.g., the power amplifier 108 in FIG. 1) based on the greatest (e.g., in magnitude) of the first delayed envelope signal 206(1), the second delayed envelope signal 204(2), and the third delayed envelope signal 206(3). The maximum current detection circuit 208 detects a maximum signal or greatest signal among the first, second, and third delayed envelope signals 206(1)-206(3) and, at any given moment, generates the maximum current signal 210 that is based on the one of the first, second, and third delayed envelope signals 206(1)-206(3) that is the highest (i.e., the maximum of the first, second, and third delayed envelope signals 206(1)-206(3)) at that moment. The analog signal provided to the power amplifier for amplification can be synchronized with the second delayed envelope signal 206(2). At any instant, it is likely that either the first delayed envelope signal 206(1) or the third delayed envelope signal 206(3) is greater in magnitude than the second delayed envelope signal 206(2), and the maximum current signal 210 will correspond to the greater one. Thus, if the second delayed envelope signal 206(2) suddenly changes based on a sudden change to the envelope signal 204, a difference in magnitude between the maximum current signal 210 and the second delayed envelope signal 206(2) creates a timing margin in which the supply voltage signal can be adjusted.

The envelope signal 204 indicates an amplitude of the envelope of the analog signal to be amplified as a voltage. Each of the delay circuits 202(1)-202(3) receives the envelope signal 204 on a signal input and generates the delayed envelope signals 206(1)-206(3) corresponding to the envelope signal 204. The delayed envelope signals 206(1)-206(3) also indicate the envelope amplitude as a voltage amplitude. In some windowing circuits, a maximum signal indicating the maximum amplitude is also a voltage signal. However, herein, after the envelope signal 204 is delayed by the delay circuits 202(1)-202(3), voltage-to-current converter circuits 214(1)-214(3) convert voltage amplitudes of the first, second, and third delayed envelope signals 206(1)-206(3) to current amplitudes and the maximum current detection circuit 208 and the voltage amplitude $V_{ENV}$ of the envelope signal 204 is converted to a maximum current $I_{ENV}$ of the maximum signal 212. The first, second, and third delayed envelope signals 206(1)-206(3) shown in FIG. 2B are single-ended indications of amplitude (i.e., relative to zero, ground, or another fixed reference point). The Y-axis of FIG. 2B is unlabeled because the amplitudes may be indicated as voltages generated by one of the delay circuits 202(1)-202(3) or as currents generated by the voltage-to-current converter circuits 214(1)-214(3).

Figure 3:
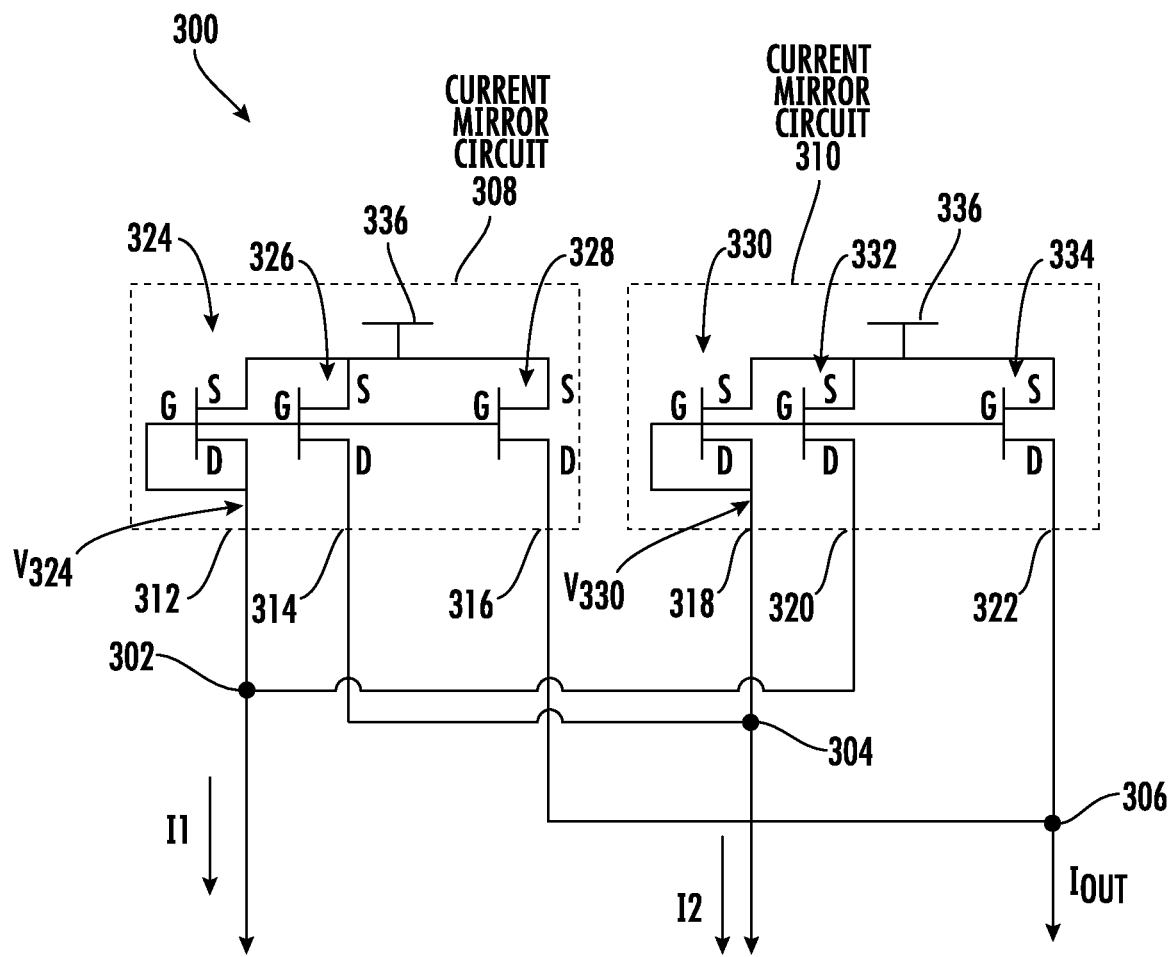
FIG. 3 is a schematic diagram of a two-input single-ended maximum current detection circuit based on current mirror circuits.

Details of one example of a two-input, single-ended maximum current detection circuit 300 are illustrated in FIG. 3 and explained with reference thereto. At a high level, the maximum current detection circuit 300 is configured to generate the larger of a first input current I1 at a first current port 302 and a second input current I2 at a second current port 304 as an output current $I_{OUT}$ on a maximum current port 306. The first input current I1 and the second input current I2 could correspond to the first delayed envelope signal 206(1) and the second delayed envelope signal 206(2) of the windowing circuit 200 in FIG. 2, in which case the third delayed envelope signal 206(3) would remain unused. Alternatively, the first input current I1 and the second input current I2 may be any two current signals, and the maximum current detection circuit 300 is configured to generate the greater of the two input currents at any given moment. Accordingly, the current $I_{OUT}$ may correspond to the first input current I1 or the second input current I2, whichever is higher. A detailed explanation of the operation of the maximum current detection circuit 300 is presented below, following a detailed description of some features of the maximum current detection circuit 300 shown in FIG. 3.

The maximum current detection circuit 300 includes a first current mirror circuit 308 and a second current mirror circuit 310. The first current mirror circuit 308 includes a first input 312 coupled to the first current port 302, a first mirror input 314 coupled to the second current port 304, and a first mirror output 316 coupled to the maximum current port 306. The second current mirror circuit 310 includes a second input 318 coupled to the second current port 304, a second mirror input 320 coupled to the first current port 302, and a second mirror output 322 coupled to the maximum current port 306.

The first current mirror circuit 308 includes transistors 324, 326, and 328, and the second current mirror circuit 310 includes transistors 330, 332, and 334, which will be collectively referred to as transistors 324-334. In this example, the transistors 324-334 may be field-effect transistors (FETs) 324-334 each, including a source, a gate, and a drain. The FETs 324-334 in the current mirror circuits 308 and 310 are of a same type and a same size. In other words, the FETs 324-334 of the current mirror circuits 308 and 310 are sized to have a same current capacity. In addition, the FETs 324-334 have a gain of "×1" when the output is in the saturated region, which occurs when a drain to source voltage $V_{DS}$=gate to source voltage $V_{GS}$, and have a gain of "×0" when the $V_{DS}$=0. In particular, the FETs 324-334 may be P-type metal-oxide-semiconductor (MOS) FETs (MOSFETs) in which a channel is formed in a semiconductor material doped with a trivalent impurity.

The transistor 324 includes a source 324S, a gate 324G, and a drain 324D, and the sources, gates, and drains of the transistors 324-334 are similarly labeled. The sources 324S-334S are coupled to a supply voltage input 336 (e.g., a supply voltage rail) that provides a power supply voltage $V_{DD}$, for example. The gates 324G, 326G, and 328G of the first current mirror circuit 308 are each coupled to the first current port 302. The first current port 302 is also coupled to the drain 324D of the transistor 324, which may be referred to as the input transistor 324. Thus, each of the transistors 324, 326, and 328 in the first current mirror circuit 308 conduct a current equal to or approximately equal to the first input current I1, depending on transistor variations. Similarly, the second current port 304 is coupled to the drain 324D of the transistor 324, which may also be referred to as the input transistor 330 the conducts the second input current I2. The gates 330G, 332G, and 334G of the second current mirror circuit 310 are also coupled to the second current port 304, causing each of the transistors 332 and 334 of the second current mirror circuit 310 to conduct a current the same or approximately the same as the second input current I2.

The drain 324D of transistor 324 in the first current mirror circuit 308 and the drain 332D of the transistor 332 in the second current mirror circuit 310 are both coupled to the first current port 302. The drain 326D of transistor 326 in the first current mirror circuit 308 and the drain 330D of the transistor 330 in the second current mirror circuit 310 are both coupled to the second current port 304. In an example of operation, with the first input current I1 provided at the first current port 302 and the second input current I2 provided at the second current port 304, the first input current I1 is provided by both the transistor 324 and the transistor 332 and the second input current I2 is provided by both the transistor 326 and the transistor 330. If the first input current I1 is greater than the second input current I2, then a voltage drop across the transistor 324 will be greater than a voltage drop across the transistor 330. Thus, a voltage $V_{324}$ on the drain 324D will be lower than a voltage $V_{330}$ on the drain 330D.

Consequently, the transistor 324 will be more fully turned on and conduct more current than the transistor 330. In addition, the transistor 326 will be more fully turned on and conduct more current than the transistor 332. Thus, the transistor 326 will provide more of the first input current I2 than the transistor 330, which will reduce the voltage $V_{330}$ on the drain of transistor 330. As the voltage $V_{330}$ is reduced, the transistor 332 provides less of the first input current I1, which increases an amount of the first input current I1 that is provided by the transistor 326. The above transitions proceed until the transistors 330, 332, and 334 are in an off state, which may be referred to as a "latched" condition, in which no current is conducted and the transistors 324, 326, and 328 each conduct the first input current I1. Since the drain 328D of the transistor 328 and the drain 334D of the transistor 334 are each coupled to the maximum current port, the first input current I1 (i.e., the greater of I1 and I2) is conducted through the maximum current port 306.

In the case in which the second input current I2 is greater than the first input current I1, the transistors 324, 326, and 328 would be put in the off state, the transistors 330, 332, and 334 would each be conducting the second input current I2, and the second current I2 would be conducted at the maximum current port 306. The above analysis can also be extended and applied to understand the operation of a three-input single-ended maximum current detection circuit.

Figure 4A:
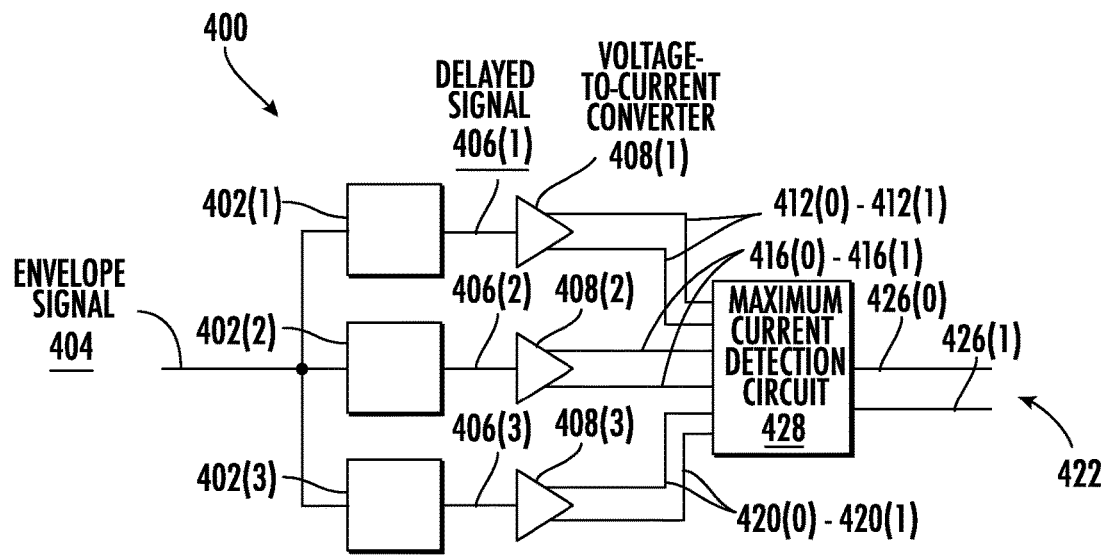
FIG. 4A is an illustration of an ET windowing function in which an analog input signal is delayed by three different delays to generate three differential current signals provided to a maximum signal detector.
Figure 4B:
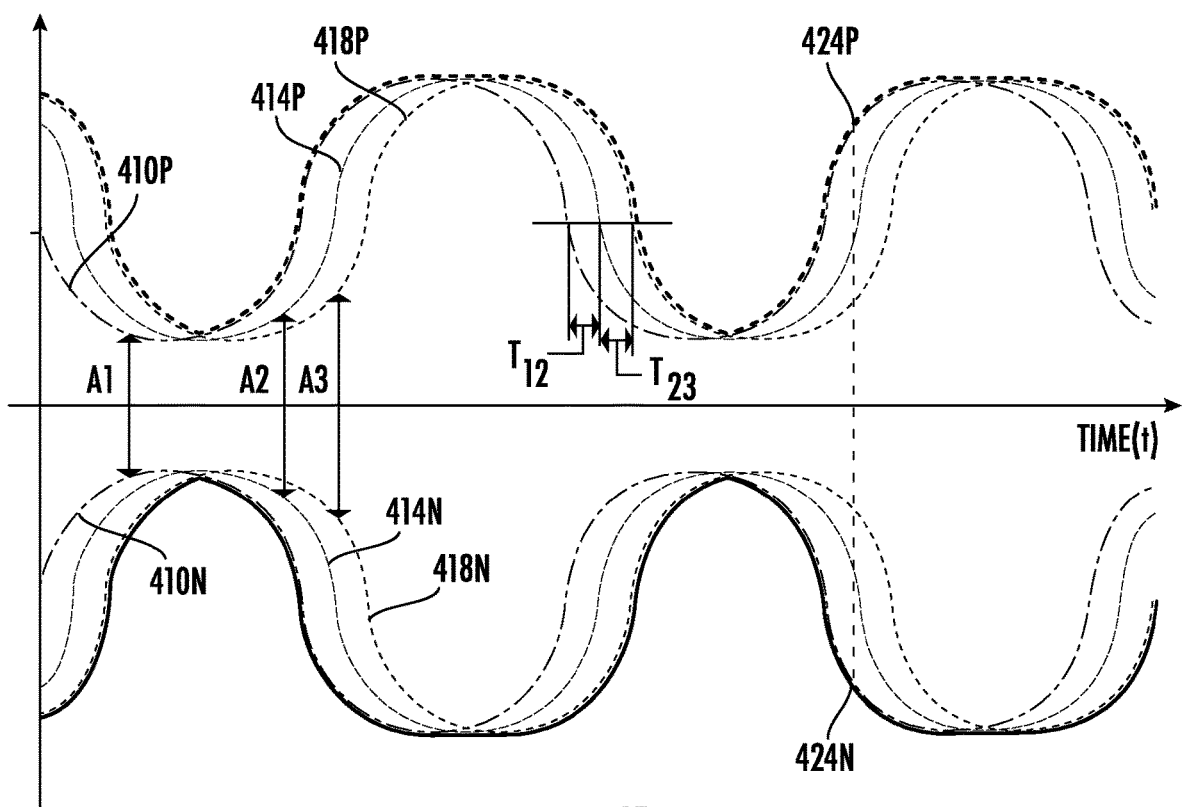
FIG. 4B is a graph of the three differential current signals provided to the maximum signal detector and a maximum current output.

In an alternative to the windowing circuit 200 shown in FIG. 2A, which provides the first, second, and third delayed envelope signals 206(1)-206(3) as single-ended currents on individual wires coupled to the maximum current detection circuit 210, FIG. 4A is a schematic diagram of a windowing circuit 400 for a differential mode of operation. Delay circuits 402(1), 402(2), and 402(3) each delay an envelope signal 404 by a different respective delay time to generate delayed signals 406(1)-406(3), where delayed signal 406(2) is delayed by time $T_{12}$ after delayed signal 406(1) and delayed signal 406(3) is delayed by time $T_{23}$ after delayed signal 406(2). The delayed signals 406(1)-406(3) are provided to voltage-to-current (V/C) converters 408(1)-408(3). The V/C converter 408(1) generates differential current signals 410P, 410N on conductors 412(0), 412(1). The V/C converter 408(2) generates differential current signals 414P, 414N on conductors 416(0), 416(1). The converter V/C 408(3) generates differential current signals 418P, 418N on conductors 420(0), 420(1). A difference between the differential current signals 410P, 410N indicates an amplitude A1. A difference between the differential current signals 414P, 414N indicates an amplitude A2. A difference between the differential current signals 418P, 418N indicates an amplitude A3. A maximum current signal 422 is indicated by differential current signals 424P, 424N on conductors 426 (0), 426(1). The maximum current signal 422 is generated by a maximum current detection circuit 428 based on the largest of the amplitudes A1, A2, and A3 at any given moment. FIG. 4B is an illustration of amplitudes A1, A2, A3 indicated as differential signals 410P, 410N, 414P, 414N, 418P, and 418N. The maximum current signal 422 is indicated by the differential signals 424P, 424N in FIG. 4B.

Figure 5A:
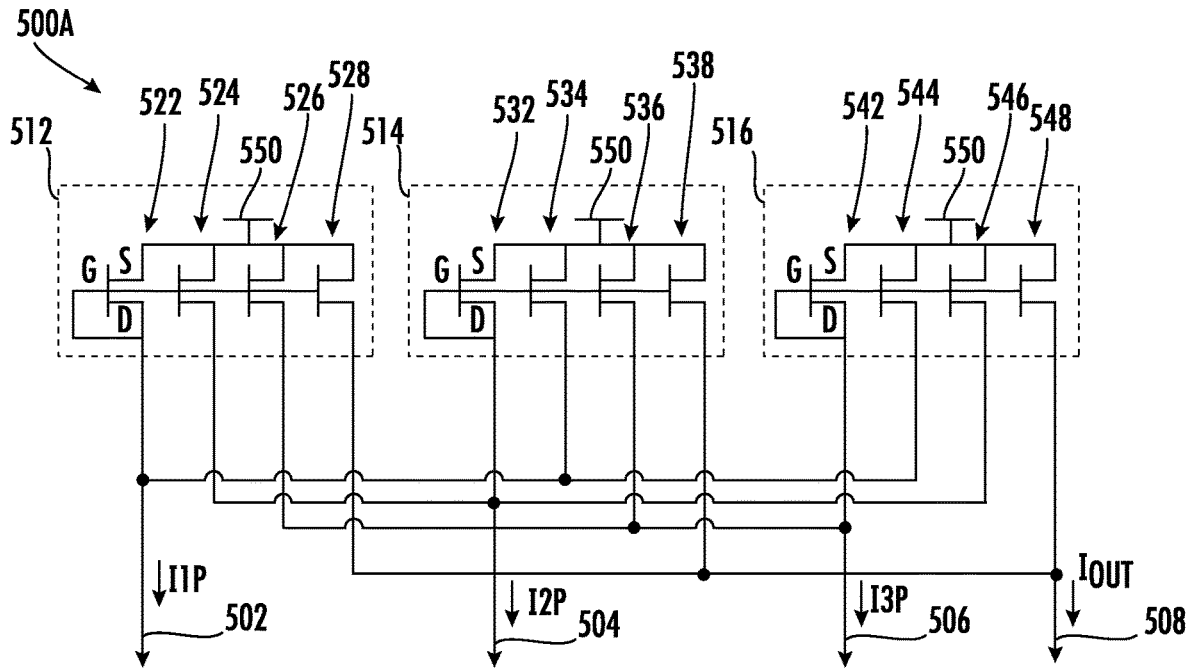
FIG. 5A is a schematic diagram of a three-input maximum current detection circuit that could operate as a single-ended circuit or as the P-type portion of a differential circuit.
Figure 5B:
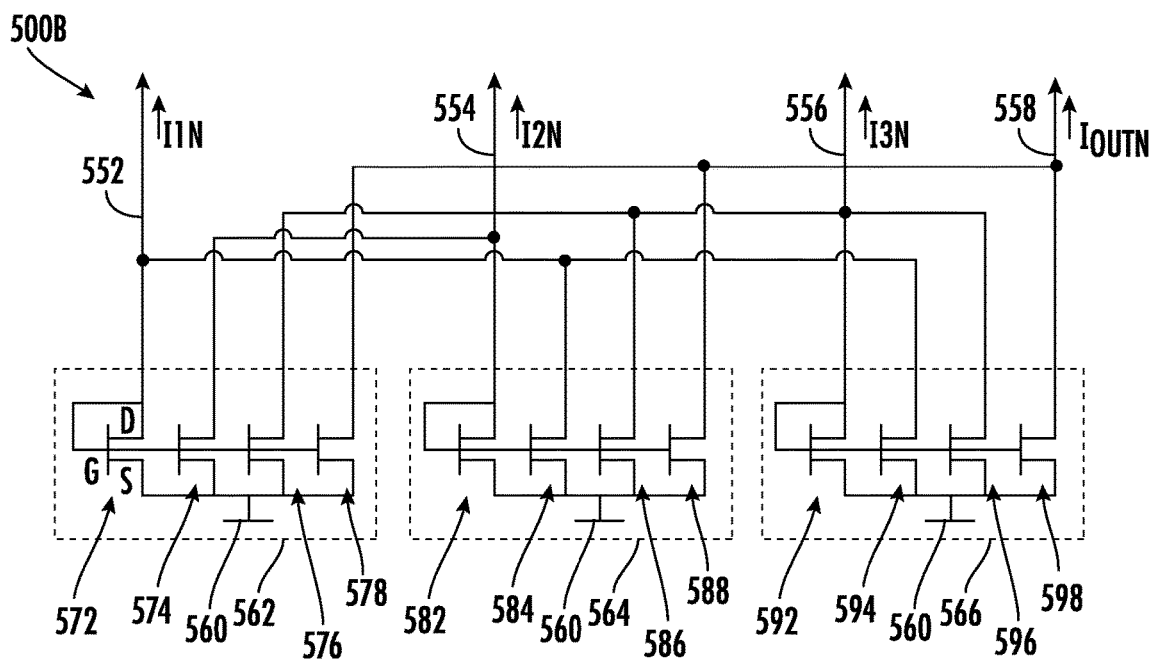
FIG. 5B is a schematic diagram of an N-type portion of a three-input differential maximum current detection circuit.

FIG. 5A is a schematic diagram of a three-input maximum current detection circuit 500A that operates alone as a single-ended circuit or can operate in combination with a maximum current detection circuit 500B in FIG. 5B as a differential circuit. The maximum current detection circuit 500A operates in accordance with the concepts described regarding the two-input maximum current detection circuit 300 in FIG. 3. A maximum current detection circuit, as disclosed herein, is not limited to being a two-input or a three-input maximum current detection circuit. In this regard, an N-input maximum current detection circuit is possible. As shown in FIGS. 3 and 5A, a number of transistors in parallel in each current mirror circuit is equal to one more than a number of the input current ports. In addition, the N-input circuit includes a number of current mirror circuits equal to the number of input current ports (N). Thus, a 5-input maximum current detection circuit is possible in which there are five current mirror circuits that each include 6 transistors coupled in parallel, as shown in FIGS. 3 and 5A. In an alternative embodiment (not shown), a 4-input maximum current detection circuit may be formed by three 2-input maximum current detection circuits as shown in FIG. 3, with two of the inputs going to a first one of the 2-input maximum current detection circuits, the other two inputs going to a second one of the maximum current detection circuits, and the outputs of the first one and the second one going to the third one of the maximum current detection circuits.

In particular, the maximum current detection circuit 500A has a first current port 502, a second current port 504, a third current port 506, and a maximum current port 508. The maximum current detection circuit 500A is configured to generate a current $I_{OUT}$ on the maximum current port 508 corresponding to the greater of the first input current I1 on the first current port 502, the second input current I2 on the second current port 504, and the third input current I3 on the third current port 506. The maximum current detection circuit 500A includes three current mirror circuits 512, 514, and 516.

Operation of the maximum current detection circuit 500A is described with respect to an example in which the first input current I1 is greater than the second input current I2 and the third input current I3. The first current port 502 is coupled to the first current mirror circuit 512, the second current port 504 is coupled to the second current mirror circuit 514, and the third current port 506 is coupled to the third current mirror circuit 516. As explained by the example below, the largest of the input currents I1, I2, and I3 drives the transistors in the corresponding current mirror circuit to generate each of the input currents I1, I2, and I3 on the current ports 502, 504, and 506, respectively, and also generate the largest one of the input currents I1-I3 as $I_{OUT}$ on the maximum current port 508. As one of the current mirror circuits 512-516 becomes dominant, the currents of the transistors in the other current mirror circuits are reduced to a point at which the input transistors (e.g., 522, 532, 542) of the other current mirror circuits are turned off (e.g., latched), which occurs when a gate to source voltage $V_{GS}$ is much less than a threshold voltage VT of the input transistors.

In detail, the first current mirror circuit 512 includes transistors 522, 524, 526, and 528. The second current mirror circuit 514 includes transistors 532, 534, 536, and 538. The third current mirror circuit 516 includes transistors 542, 544, 546, and 548. The sources, gates, and drains are labeled as in FIG. 3. The sources of all the transistors in the first, second, and third current mirror circuits 512, 514, and 516 are coupled to a supply voltage source 550. The gates of the transistors 522, 524, 526, and 528 of the first current mirror circuit 512 are each coupled to the first current port 502. The first current port 502 is also coupled to the drain 522D of the input transistor 522 of the first current mirror circuit 512, the drain 534D of the transistor 532 of the second current mirror circuit 514, and the drain 544D of the transistor 544 of the third current mirror circuit 516. The gates of the transistors 532, 534, 536, and 538 are coupled to the second current port 504. The second current port 504 is also coupled to the drain 524D of the transistor 524 of the first current mirror circuit 512, the drain 532D of the transistor 532 of the second current mirror circuit 514, and the drain 546D of the transistor 546 of the third current mirror circuit 516. The gates of the transistors 542, 544, 546, and 548 in the third current mirror circuit 516 are coupled to the third current port 506, and the third current port 506 is also coupled to the drain 526D of the transistor 526 of the first current mirror circuit 512, the drain 536D of the transistor 536 of the second current mirror circuit 514, and the drain 542D of the transistor 546 of the third current mirror circuit 516. The maximum current port 508 is also coupled to the drain 528D of the transistor 528, the drain 538D of the transistor 538, and the drain 548D of the transistor 538 of the first, second, and third current mirror circuits 512, 514, and 516, respectively.

In the example in which the first input current I1 is the greatest at a given moment, the transistors 524 and 526 are turned on to conduct the first input current I2 to the second current port 504 and the third current port 506, respectively. As such, the transistors of the second and third current mirror circuits 514 and 516 turn off, and the maximum current port conducts the first input current I1 from the transistor 528.

The transistors of the first, second, and third current mirror circuits 512, 514, and 516 may be P-type transistors that strongly pass the supply voltage $V_{DD}$. The maximum current detection circuit 500A may be either a single-ended circuit or a P-side of a differential maximum current detection circuit 500A/B, with the maximum current detection circuit 500B in FIG. 5B being the N-side. The maximum current detection circuit 500B includes N-type transistors that strongly pass a reference voltage (e.g., 0 volts) from a reference voltage source. The maximum current detection circuit 500B includes input current ports 552, 554, and 556 coupled to current mirror circuits 562, 564, and 566, respectively, such that the maximum current detection circuit 500B is symmetric (e.g., a mirror image) to the maximum current detection circuit 500A. The input current ports 552, 554, and 556 generate currents I4, I5, and I6, respectively. A maximum current $I_{OUTN}$ is generated on maximum current port 558.

A first amplitude A1 as shown in FIG. 4B, is indicated based on input current I1P and input current I1N in the current ports 502 and 552. A second amplitude A2 is based on the input current I2P on second current port 504 and input current I2N on input current port 554. A third amplitude A3 is indicated based on the input current I3P in third current port 506 and input current I3N on input current port 556.

In detail, the current mirror circuit 562 includes transistors 572, 574, 576, and 578. The current mirror circuit 564 includes transistors 582, 584, 586, and 588. The current mirror circuit 566 includes transistors 592, 594, 596, and 598. The sources (S), gates (G), and drains (D) are labeled as in FIG. 5A. The sources of all the transistors in the first, second, and third current mirror circuits 512, 514, and 516 are coupled to a reference voltage source 560. The gates of the transistors 572, 574, 576, and 578 of the current mirror circuit 562 are each coupled to the current port 552. The current port 552 is also coupled to the drain 572D of the transistor 572 of the current mirror circuit 562, the drain 584D of the transistor 584 of the current mirror circuit 564, and the drain 594D of the transistor 594 of the current mirror circuit 566. The gates of the transistors 582, 584, 586, and 588 are coupled to the second current port 554. The second current port 554 is also coupled to the drain 574D of the transistor 574 of the current mirror circuit 562, the drain 582D of the input transistor 582 of the current mirror circuit 564, and the drain 596D of the transistor 596 of the current mirror circuit 566. The gates of the transistors 592, 594, 596, and 598 in the current mirror circuit 566 are coupled to the third current port 556, and the third current port 556 is also coupled to the drain 526D of the transistor 526 of the current mirror circuit 562, the drain 536D of the transistor 536 of the current mirror circuit 564, and the drain 592D of the input transistor 592 of the current mirror circuit 566. The maximum current port 598 is also coupled to the drain 578D, the drain 588D, and the drain 598D of the corresponding transistors 578, 588, and 598, of the first, second, and third current mirror circuits 562, 564, and 566, respectively.

Operation of the maximum current detection circuit 500B corresponds to operation of the maximum current detection circuit 500A described above and will not be separately described.

Figure 6:
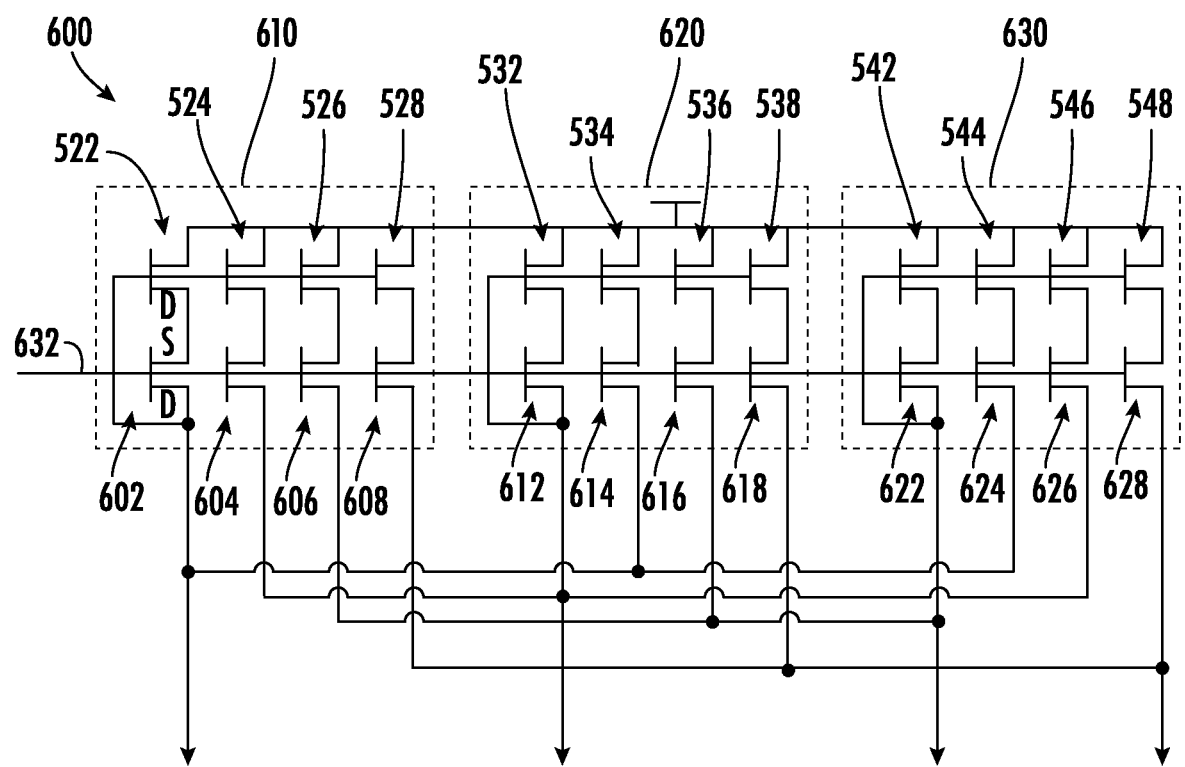
FIG. 6 is a schematic diagram of a three-input single-ended maximum current detection circuit in which each mirror circuit includes cascode circuits.

FIG. 6 is a schematic diagram of a maximum current detection circuit 600 corresponding to the maximum current detection circuit 500A with similar features being similarly labeled. However, the maximum current detection circuit 600 includes cascode transistors 602, 604, 606, and 608 in a first current mirror circuit 610, cascode transistors 612, 614, 616, and 618 in a second current mirror circuit 620, and cascode transistors 622, 624, 626, and 628 in a third current mirror circuit 630. Regarding the first current mirror circuit 610 as an example, the cascode transistor 602 is coupled in series with the transistor 522, with a source 602S of the cascode transistor 602 coupled to the drain 522D of the transistor 522 and a drain 602D coupled to the first current port. The cascode transistors 604, 606, and 608 are similarly coupled in series between the transistors 524, 526, and 528, respectively, and the current ports 504, 506, and 508. Inserting the cascode transistor 602 reduces a voltage applied to the gate 522G and may improve response time. The cascode transistors 612-618 and 622-628 are similarly provided in the current mirror circuits 620 and 630. The gates of all the cascode transistors may be coupled to a shared control signal 632, which keeps all of the cascode transistors turned on to a same extent.

FIG. 7 is a schematic diagram of a three-input single-ended maximum current detection circuit 700 corresponding to the maximum current detection circuit 500A in FIG. 5A. However, the maximum current detection circuit 700 includes resistors 702, 704, and 706 placed in series with the transistors 522, 532, and 542, respectively, which conduct the first, second, and third input currents I1, I2, and I3, respectively. Inserting the resistor 702 between the drain 522D of the transistor 522 in the first current mirror circuit 512 causes the gates of the transistors 522, 524, 526, and 528 to be lower than a voltage of the drain 522D. In this regard, the resistor 702 provides a feedback loop gain to reduce switching delays.

FIGS. 8A and 8B are schematic diagrams of a three-input differential maximum current detection circuit 800A/B, including a P-type maximum current detection circuit 800A corresponding to the maximum current detection circuit 500A in FIG. 5A and an N-type maximum current detection circuit 800B corresponding to the maximum current detection circuit 500B in FIG. 5B. The maximum current detection circuit 800A includes the resistors 702, 704, and 706 shown in FIG. 7 to increase feedback loop gain in the maximum current detection circuit 800A. Similarly, the maximum current detection circuit 800B in FIG. 8B includes corresponding resistors 802, 804, and 806 to increase feedback loop gain of the current mirror circuits 562, 564, and 566, respectively. The maximum current detection circuits 800A and 800B also include output cascode transistors 808A and 808B, respectively. In the maximum current detection circuits 800A, for example, the output cascode transistor 808A is coupled between the first, second, and third current mirror circuits 512, 514, and 516, and the maximum current port 508. The output cascode transistor 808A sets a voltage on the drains of the transistors 528, 538, and 548 to better match the voltages on the drains of the transistors 522, 532, and 542 coupled to voltage-to-current converter circuits.

It is contemplated that any of the foregoing aspects and/or various separate aspects and features as described herein may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A maximum current detection circuit comprising:
   a first current port;
   a second current port;
   a maximum current port;
   a first current mirror circuit comprising:
      a first input coupled to the first current port;
      a first mirror input coupled to the second current port; and
      a first mirror output coupled to the maximum current port; and
   a second current mirror circuit comprising:
      a second input coupled to the second current port;
      a second mirror input coupled to the first current port; and
      a second mirror output coupled to the maximum current port.

2. The maximum current detection circuit of claim 1, wherein:
   the first current mirror circuit comprises:
      a first transistor, a second transistor, and a third transistor, each comprising:
         a source coupled to a supply voltage input; and
         a gate coupled to the first current port;
      wherein:
         a drain of the first transistor is coupled to the first current port;
         a drain of the second transistor is coupled to the second current port; and
         a drain of the third transistor is coupled to the maximum current port; and
   the second current mirror circuit comprises:
      a fourth transistor, a fifth transistor, and a sixth transistor, each comprising:
         a source coupled to the supply voltage input; and
         a gate coupled to the second current port;
      wherein:
         a drain of the fourth transistor is coupled to the second current port;
         a drain of the fifth transistor is coupled to the first current port; and
         a drain of the sixth transistor is coupled to the maximum current port.

3. The maximum current detection circuit of claim 2, further comprising:
   a third current port; and
   a third current mirror circuit comprising:
      a seventh transistor, an eighth transistor, a ninth transistor, and a tenth transistor, each comprising:
         a source coupled to the supply voltage input; and
         a gate coupled to a third current port;
      wherein:

a drain of the seventh transistor is coupled to the third current port;
a drain of the eighth transistor is coupled to the first current port;
a drain of the ninth transistor is coupled to the second current port;
a drain of the tenth transistor is coupled to the maximum current port;
the first current mirror circuit further comprises an eleventh transistor comprising:
a source coupled to the supply voltage input;
a gate coupled to the first current port; and
a drain coupled to the third current port; and
the second current mirror circuit further comprises a twelfth transistor comprising:
a source coupled to the supply voltage input;
a gate coupled to the second current port; and
a drain coupled to the third current port.

4. The maximum current detection circuit of claim 2, wherein the second transistor, third transistor, fourth transistor, fifth transistor, and sixth transistor are a same size as the first transistor.

5. The maximum current detection circuit of claim 2, wherein the second transistor, third transistor, fourth transistor, fifth transistor, and sixth transistor are configured to have a same current capacity as the first transistor.

6. The maximum current detection circuit of claim 2, further comprising:
an envelope signal input;
a first delay circuit comprising a first signal input coupled to the envelope signal input and configured to generate a first delayed envelope signal on a signal delay output, the first delayed envelope signal comprising a current amplitude based on a voltage amplitude on the envelope signal input delayed by a first delay; and
a second delay circuit comprising a second signal input coupled to the envelope signal input and configured to generate a second delayed envelope signal on a signal delay output, the second delayed envelope signal comprising the current amplitude based on the voltage amplitude on the envelope signal input delayed by a second delay;
wherein:
the signal delay output of the first delay circuit is coupled to the first current port; and
the signal delay output of the second delay circuit is coupled to the second current port.

7. The maximum current detection circuit of claim 3, further comprising:
an envelope signal input;
a first delay circuit comprising a signal delay input coupled to the envelope signal input and configured to generate a first delayed envelope signal on a first signal delay output, the first delayed envelope signal comprising a current amplitude based on a voltage amplitude on the envelope signal input delayed by a first delay;
a second delay circuit comprising a signal delay input coupled to the envelope signal input and configured to generate a second delayed envelope signal on a second signal delay output, the second delayed envelope signal comprising the current amplitude based on a voltage amplitude on the envelope signal input delayed by a second delay and
a third delay circuit comprising a signal delay input coupled to the envelope signal input and configured to generate a third delayed envelope signal on a third signal delay output, the third delayed envelope signal comprising a current amplitude based on a voltage amplitude on the envelope signal input delayed by a third delay;
wherein:
the first signal delay output is coupled to the first current port;
the second signal delay output is coupled to the second current port; and
the third signal delay output is coupled to the third current port.

8. The maximum current detection circuit of claim 2, wherein:
the first current port comprises a first P-type current port;
the second current port comprises a second P-type current port;
the maximum current port comprises a maximum P-type current port;
the first transistor, second transistor, third transistor, fourth transistor, fifth transistor, and sixth transistor comprise a first P-type transistor, second P-type transistor, third P-type transistor, fourth P-type transistor, fifth P-type transistor, and sixth P-type transistor; and
the maximum current detection circuit further comprises:
a first N-type current port;
a second N-type current port;
a maximum N-type current port:
a first N-type current mirror circuit comprising:
a first N-type transistor, a second N-type transistor, and a third N-type transistor, each comprising:
a source coupled to a reference voltage input; and
a gate coupled to the first N-type current port;
wherein:
a drain of the first N-type transistor is coupled to the first N-type current port;
a drain of the second N-type transistor is coupled to the second N-type current port; and
a drain of the third N-type transistor is coupled to the maximum N-type current port; and
a second N-type current mirror circuit comprises:
a fourth N-type transistor, a fifth N-type transistor, and a sixth N-type transistor, each comprising:
a source port coupled to the reference voltage input; and
a gate port coupled to the second N-type current port;
wherein:
a drain port of the fourth N-type transistor is coupled to the second N-type current port;
a drain port of the fifth N-type transistor is coupled to the first N-type current port; and
a drain port of the sixth N-type transistor is coupled to the maximum N-type current port.

9. The maximum current detection circuit of claim 2, further comprising:
a first resistor coupled between the drain of the first transistor and the first current port; and
a second resistor coupled between the drain of the second transistor and the second current port.

10. The maximum current detection circuit of claim 8, further comprising:
a first resistor coupled between the drain of the first P-type transistor and the first P-type current port;
a second resistor coupled between the drain of the second P-type transistor and the second P-type current port;
a third resistor coupled between the drain of the first N-type transistor and the first N-type current port; and a fourth resistor coupled between the drain of the second N-type transistor and the second N-type current port.

11. The maximum current detection circuit of claim 2, further comprising:
an output transistor comprising:
a source coupled to the drain of the third transistor and the drain of the sixth transistor; and
a drain coupled to the maximum current port.

12. The maximum current detection circuit of claim 9, further comprising:
an output transistor comprising:
a source coupled to the drain of the third transistor and the drain of the sixth transistor; and
a drain coupled to the maximum current port.

13. The maximum current detection circuit of claim 8, further comprising:
a P-type output transistor comprising:
a source coupled to the drain of the third P-type transistor and the drain of the sixth P-type transistor; and
a drain coupled to the maximum current port; and
an N-type output transistor comprising:
a source coupled to the drain of the third N-type transistor and the drain of the sixth N-type transistor; and
a drain coupled to the maximum current port.

14. The maximum current detection circuit of claim 2, further comprising:
a first cascode transistor comprising:
a source coupled to the drain of the first transistor; and
a drain coupled to the first current port; and
a second cascode transistor comprising:
a source coupled to the drain of the second transistor; and
a drain coupled to the second current port;
a third cascode transistor comprising:
a source coupled to the drain of the third transistor; and
a drain coupled to the maximum current port;
a fourth cascode transistor comprising:
a source coupled to the drain of the fourth transistor; and
a drain coupled to the second current port; and
a fifth cascode transistor comprising:
a source coupled to the drain of the fifth transistor; and
a drain coupled to the first current port; and
a sixth cascode transistor comprising:
a source coupled to the drain of the sixth transistor; and
a drain coupled to the maximum current port.

15. The maximum current detection circuit of claim 8, further comprising:
a first N-type cascode transistor comprising:
a source coupled to the drain of the first N-type transistor; and
a drain coupled to the first N-type current port; and
a second N-type cascode transistor comprising:
a source coupled to the drain of the second N-type transistor; and
a drain coupled to the second N-type current port;
a third N-type cascode transistor comprising:
a source coupled to the drain of the third N-type transistor; and
a drain coupled to the maximum N-type current port;
a fourth N-type cascode transistor comprising:
a source coupled to the drain of the fourth N-type transistor; and
a drain coupled to the second N-type current port; and
a fifth N-type cascode transistor comprising:
a source coupled to the drain of the fifth N-type transistor; and
a drain coupled to the first N-type current port;
a sixth N-type cascode transistor comprising:
a source coupled to the drain of the sixth N-type transistor; and
a drain coupled to the maximum N-type current port;
a first P-type cascode transistor comprising:
a source coupled to the drain of the first P-type transistor; and
a drain coupled to the first P-type current port; and
a second P-type cascode transistor comprising:
a source coupled to the drain of the second P-type transistor; and
a drain coupled to the second P-type current port;
a third P-type cascode transistor comprising:
a source coupled to the drain of the third P-type transistor; and
a drain coupled to the maximum P-type current port;
a fourth P-type cascode transistor comprising:
a source coupled to the drain of the fourth P-type transistor; and
a drain coupled to the second P-type current port; and
a fifth P-type cascode transistor comprising:
a source coupled to the drain of the fifth P-type transistor; and
a drain coupled to the first P-type current port; and
a sixth P-type cascode transistor comprising:
a source coupled to the drain of the sixth P-type transistor; and
a drain coupled to the maximum P-type current port.

16. A wireless device comprising:
a transceiver configured to generate, based on a received analog signal:
an output analog signal on a signal output; and
an envelope signal based on a magnitude envelope of the output analog signal on an envelope output;
a delay circuit configured to:
receive the envelope signal on a signal input;
generate a first delayed envelope signal based on the envelope signal on a first delay output;
generate a second delayed envelope signal based on the envelope signal on a second delay output; and
generate a third delayed envelope signal based on the envelope signal on a third delay output;
a maximum current detection circuit comprising:
a first current port coupled to the first delay output;
a second current port coupled to the second delay output;
a third current port coupled to the third delay output;
a maximum current port;
a first current mirror circuit comprising:
a first input coupled to the first current port;
a first mirror input coupled to the second current port; and
a first mirror output coupled to the maximum current port; and
a second current mirror circuit comprising:
a second input coupled to the second current port;
a second mirror input coupled to the first current port; and
a second mirror output coupled to the maximum current port; and
a power amplifier configured to amplify the output analog signal based on a supply voltage based on a maximum current on the maximum current port.

* * * * *

UNITED STATES PATENT AND TRADEMARK OFFICE
CERTIFICATE OF CORRECTION

| | | |
|---|---|---|
| PATENT NO. | : 12,244,270 B2 | Page 1 of 1 |
| APPLICATION NO. | : 17/576306 | |
| DATED | : March 4, 2025 | |
| INVENTOR(S) | : Marcus Granger-Jones | |

It is certified that error appears in the above-identified patent and that said Letters Patent is hereby corrected as shown below:

In the Specification

In Column 5, at Line 41, change "arriving at time to" to read --arriving at time t0--.

Signed and Sealed this
Fifteenth Day of April, 2025

Coke Morgan Stewart
*Acting Director of the United States Patent and Trademark Office*